(12) United States Patent
De Santis et al.

(10) Patent No.: US 7,420,849 B2
(45) Date of Patent: Sep. 2, 2008

(54) MEMORY DEVICE DISTRIBUTED CONTROLLER SYSTEM

(75) Inventors: Luca De Santis, Avezzano (IT); Luigi Pilolli, L'Aquila (IT)

(73) Assignee: Micron Technology, Inc., Boise, ID (US)

( * ) Notice: Subject to any disclaimer, the term of this patent is extended or adjusted under 35 U.S.C. 154(b) by 48 days.

(21) Appl. No.: 11/508,728

(22) Filed: Aug. 23, 2006

(65) Prior Publication Data
US 2007/0211529 A1  Sep. 13, 2007

(30) Foreign Application Priority Data
Mar. 13, 2006  (IT) ................. RM2006A0139

(51) Int. Cl.
*G11C 11/34* (2006.01)
*G11C 16/06* (2006.01)
(52) U.S. Cl. .................. 365/185.23; 365/185.17
(58) Field of Classification Search ............ 365/185.23, 365/185.17
See application file for complete search history.

(56) References Cited

U.S. PATENT DOCUMENTS

| | | | |
|---|---|---|---|
| 5,715,193 A | 2/1998 | Norman | |
| 5,845,095 A | 12/1998 | Reed et al. | |
| 6,073,243 A | 6/2000 | Dalvi et al. | |
| 6,684,345 B2 * | 1/2004 | Harari et al. | .................. 714/8 |
| 6,959,361 B2 | 10/2005 | Schulz et al. | |
| 7,161,850 B2 * | 1/2007 | Shiga et al. | ............ 365/189.05 |
| 7,254,071 B2 * | 8/2007 | Tu et al. | ..................... 365/201 |
| 2005/0057970 A1 | 3/2005 | Ogura et al | |
| 2006/0039207 A1 | 2/2006 | Combe et al. | |

\* cited by examiner

*Primary Examiner*—Hoai V. Ho
*Assistant Examiner*—Kretelia Graham
(74) *Attorney, Agent, or Firm*—Leffert Jay & Polglaze, P.A.

(57) ABSTRACT

A memory device distributed controller circuit distributes memory control functions amongst a plurality of memory controllers. A master controller receives an interpreted command and activates the appropriate slave controllers depending on the command. The slave controllers can include a data cache controller that is coupled to and controls the data cache and an analog controller that is coupled to and controls the analog voltage generation circuit. The respective controllers have appropriate software/firmware instructions that determine the response the respective controllers take in response to the received command.

22 Claims, 6 Drawing Sheets

MEMORY DEVICE DISTRIBUTED CONTROLLER SYSTEM

RELATED APPLICATION

This application claims priority to Italian Patent Application Serial No. RM2006A000139, filed Mar. 13, 2006, entitled "MEMORY DEVICE DISTRIBUTED CONTROLLER SYSTEM," which is commonly assigned.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Common uses for flash memory include personal computers, personal digital assistants (PDAs), digital cameras, and cellular telephones. Program code and system data such as a basic input/output system (BIOS) are typically stored in flash memory devices for use in personal computer systems.

Flash memory devices typically use a floating gate, one-transistor memory cell that allows for high memory densities, high reliability, and low power consumption. The adjustment of the charge on the floating gate determines a threshold voltage ($V_t$) for the cell and, therefore, the programmed/erased state of the cell. For example, when the memory cell has a negative threshold, it has a logical "1" state. When the threshold is positive, the cell has a logical "0" state. Typically, an erased memory cell is at a logical "1" state.

In order to reduce the price per bit, memory manufacturers have created multi-level flash memory cells that are capable of storing multiple bits per cell. When one memory cell stores "n" bits of data, the memory cell has $2^n$ states or $2^n$ threshold voltage levels. For example, if a memory cell stores two data bits, the cell has four threshold voltage ($V_t$) bands.

Two common types of flash memory array architectures are the "NAND" and "NOR" architectures. These architectures are named for the resemblance that the basic memory cell configuration of each architecture has to a basic NAND or NOR gate circuits, respectively.

Flash memory devices are programmed and erased by sequences of operations. A program operation typically involves sequentially applying a programming pulse and a program-verify read pulse to a block of memory cells of the device. The programming pulse/read operation is repeated, with the programming pulse increasing incrementally each time, until the cells are programmed.

An erase operation typically comprises a pre-programming cycle, an erase cycle, and a soft program cycle. The pre-programming cycle puts the memory cell into a known programmed state by applying a program pulse to each row of memory cells in the memory block. The erase cycle removes charge from the floating gate to make it more negative. The soft program cycle corrects the cell for over-erasure after the erase cycle has been completed. By applying a programming pulse that has a lower amplitude than a normal programming pulse, the threshold voltage for the over-erased cell is brought back to an appropriate level.

FIG. 1 illustrates a block diagram of a typical prior art flash memory device. Such a device is comprised of a memory array 101 for storing data. The memory array 101 is comprised of a plurality of memory cells, as described previously, that are connected in a row and column format. The rows of cells are coupled by word lines and the columns are coupled by bit lines.

A data cache 103 is coupled to the array 101 and temporarily stores data to be written into the array 101 and data that has been read out of the array 101. The data in/out block 105 is the control circuitry for controlling the reading and writing of in and out of the array 101.

A fuse area 106 in a non-volatile area of memory for storing memory parameters that concern chip behavior. These parameters can include memory block lock commands, voltages, timing, and other such types of parameters. The analog block 108 is responsible for generating the various voltages required for integrated circuit operation. For example, the writing and erase operations require different voltages be applied to the various selected and unselected word lines and bit lines.

A command state machine (CSM) 112 is coupled to an algorithm controller 110 and interprets user commands that are entered through the integrated circuit pads 114. The algorithm controller 110 is typically a state machine or processor that generates the control signals and signal sequences for the read, program, and erase operations in response to the interpreted commands from the CSM 112. The controller 110 also controls the generation of the analog voltages from the analog block 108.

The flash memory device control circuit 110 manages the various components of the flash memory by performing the above-described memory operations. The controller interacts with hardwired actuators to send actuator signals to analog voltage generators of the memory device for controlling the voltage generators during program, erase, and other memory operations.

One problem with these controllers and hardwired actuators is that they are a fixed design for a particular application. The circuits cannot be readily reconfigured or updated for other applications. This limits the flexibility of the flash memory device.

For the reasons stated above, and for other reasons stated below which will become apparent to those skilled in the art upon reading and understanding the present specification, there is a need in the art for memory controller circuitry that can be adapted to different applications.

SUMMARY

The above-mentioned problems with memory devices and other problems are addressed by the present invention and will be understood by reading and studying the following specification.

The embodiments of the present invention encompass a distributed controller system in a flash memory device. The memory device comprises a memory array, an analog voltage generating circuit, and a data cache. The distributed controller system, in one embodiment, comprises a data cache controller that is coupled to and adapted to control the data cache, an analog controller coupled to and adapted to control the analog voltage generating circuit, and a master controller coupled to and adapted to control the memory array. Alternate embodiments have different quantities and types of controllers. Once the controllers are activated, in response to a received command, they can control their respective memory peripheral circuits in response to their respective software/firmware instructions.

Further embodiments of the invention include methods and apparatus of varying scope.

DETAILED DESCRIPTION

Figure 1:
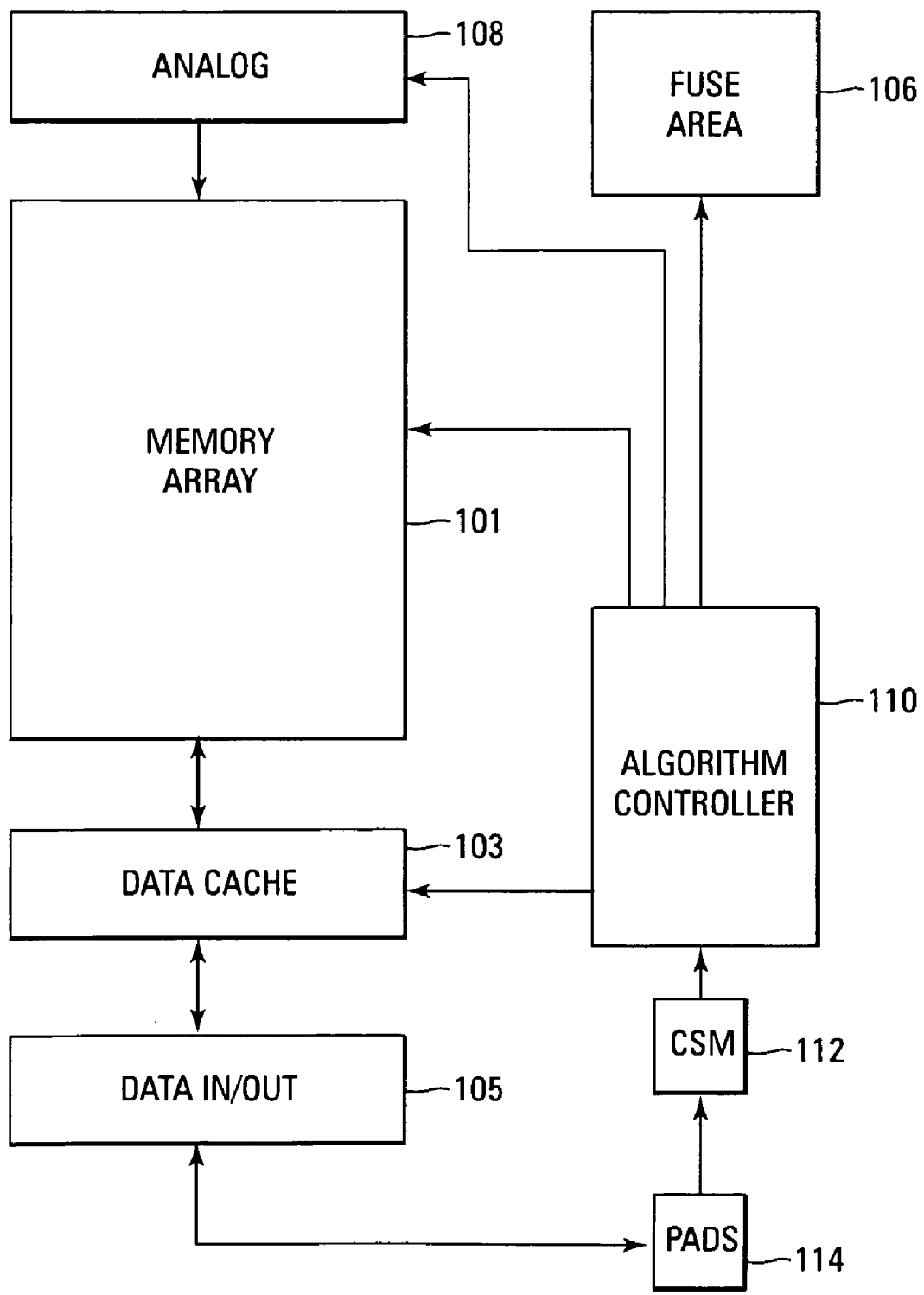
FIG. 1 shows a block diagram of a typical prior art flash memory device of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
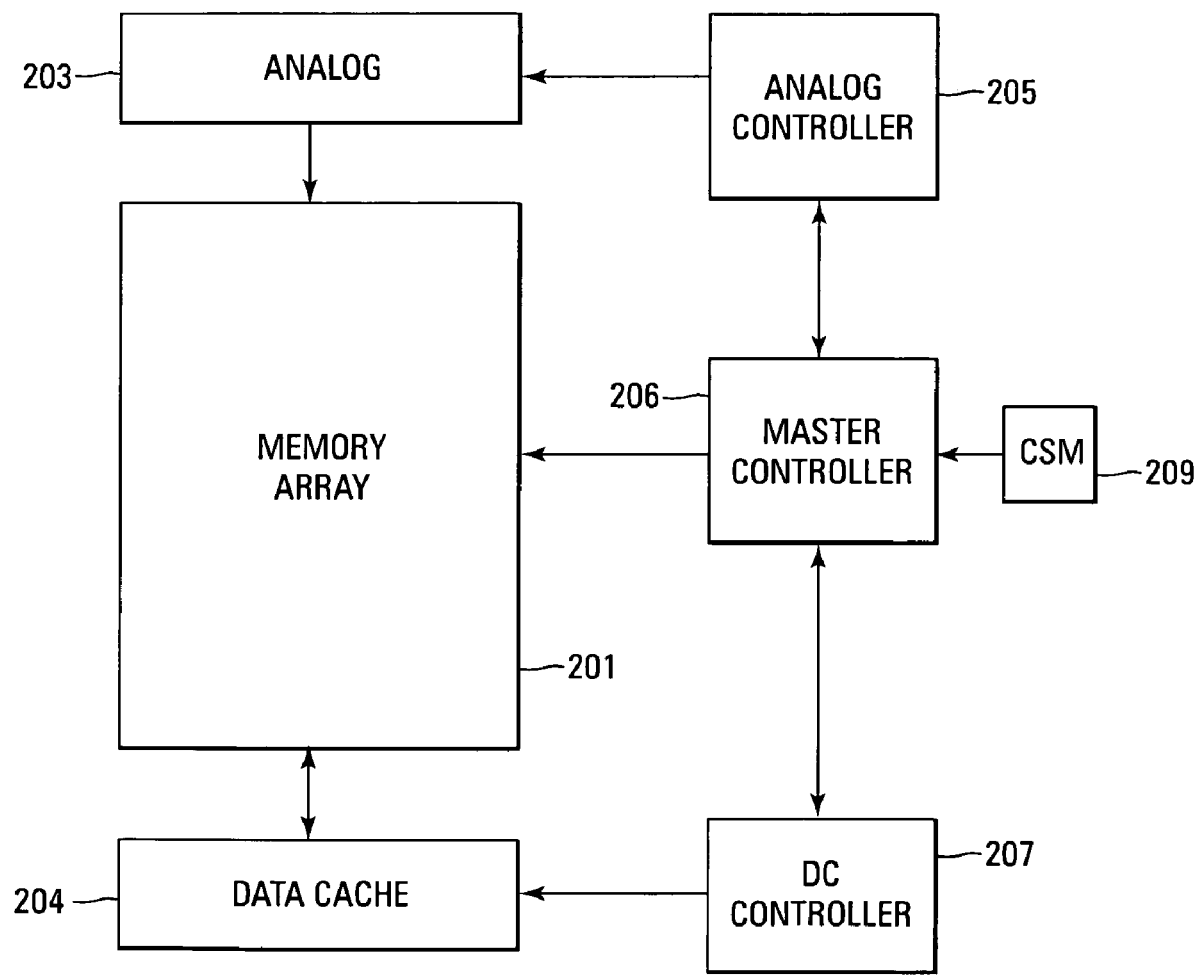
FIG. 2 shows a block diagram of a memory device of the present invention with a distributed controller circuit.

FIG. 2 illustrates a block diagram of one embodiment of a memory device of the present invention with a distributed controller. For purposes of clarity, only the blocks necessary for understanding the distributed controller are illustrated.

The distributed controller of the present invention breaks up the control functions of the memory device and distributes the different functions amongst multiple controllers. The embodiment illustrated in FIG. 2 uses three separate controllers. Alternate embodiments may use other quantities of controllers depending on the tasks required of each separate controller.

The memory device is comprised of the memory array 201 that is made up of a plurality of memory cells coupled in a row and column format. The memory rows are coupled together by word lines and the columns are coupled together by bit lines. In a NAND flash memory device, each bit line column makes up a serial string of cells. Alternate embodiments include NOR architecture memory, AND architecture memory, or other memory formats, both volatile and non-volatile.

A data cache 204 is coupled to the memory array 201. The data cache 204 is a buffer that temporarily stores data that is read from the memory array 201 and data to be written to the memory array 201.

An analog function 203 generates the various voltages required for proper operation of the memory array 201. For example, flash memory cells might required anywhere from +16V to +20V for programming and negative voltages may be required for erasing the cells.

The controller circuit is divided up into three separate controllers 205-207. The first controller 205 is the analog controller 205. This controller 205 is coupled to and is responsible for controlling the analog voltage block 203. The analog controller 205 generates signals to instruct the analog voltage block 203 to generate the different voltages required for proper operation of the memory array cells, as described previously. The analog controller 205 generates these instructions in response to a received command such as memory read, write, or erase commands.

A data cache controller 207 is coupled to and responsible for controlling the data cache 204. The data cache controller 207 generates the necessary signals to enable the cache 204 during read and write operations. For example, if a read memory command is received, the data cache controller 207 generates the signals that cause the data cache 204 to accept data from the memory array 201. If a write memory command is received, the data cache controller 207 generates the necessary signals to cause the cache 204 to accept data from external data pads of the integrated circuit and to allow the data through to the memory array 201 for programming. If the cache 204 has a high impedance state, the controller can generate the control signals to initiate this state.

The master controller 206 is coupled to and responsible for controlling the memory array 201. This controller 206 is also coupled to the other two controllers 205, 207 and generates the necessary signals to activate them as well.

When a user command (e.g., read, write, erase) is received by the CSM 209, it is interpreted and sent to the master controller 206. The master controller 206 then decides which of the other controllers 205, 207 is to be activated.

For example, if an erase command is received, the master controller 206 sends a signal to the analog controller 205 that the erase command has been received. The analog controller 205 then determines which voltages are required to erase the desired memory block and instructs the analog voltage block 203 to generate those voltages.

If a program or write data command is received by the CSM 209, the master controller 206 is informed of the command by the CSM 209. The master controller 206 sends a signal to the data cache controller 207 that a write command has been received. The data cache controller 207 determines that this command requires the data cache 204 to accept data from the data input pins of the integrated circuit and to present that data to the memory array 201.

The master controller 206 also sends a signal to the analog controller 205 that the write command has been received. The analog controller 205 determines which voltages are required to program the data into the memory array 201 and instructs the analog voltage block 203 to generate these voltages. The master controller 206 also generates the signals required by the array 201 to perform a memory write. For example, the master controller 206 may generate the signals to turn on the select gate drain and select gate source transistors that allow the memory cells to be accessed.

If a read command is received by the CSM 209, the master controller 206 is informed of the command by the CSM 209. The master controller 206 sends a signal to the data cache controller 207 that the read command has been received. The data cache controller 207 determines that a read command requires the data cache 204 to accept data from the memory array 201. The controller 207 generates the required signals to enable the cache 204 to perform this act.

The master controller 206 also sends a signal to the analog controller 205 that the read command has been received. The analog controller 205 determines which analog voltages are required by the memory cells of the array 201 to perform a read operation. The controller 205 then instructs the analog voltage block 203 to generate these voltages.

The master controller 206 also generates the signals required by the memory array 201 to perform the read command. For example, the master controller 206 may generate the control signals that turn on the select gate drain and select gate source transistors, thus allowing access to a particular series string of memory.

In an alternate embodiment, the distributed controller system has multiple analog controllers and/or multiple data cache controllers with one or more master controllers. In such an embodiment, the memory device may have more than one memory array, requiring separate analog voltage generation circuits and separate data caches for each separate array.

The embodiment of FIG. 2 shows the flexibility afforded by the distributed controller system of the present invention. Each controller circuit is coupled to a different portion of the memory peripheral circuitry (i.e., analog voltage block, data cache). If analog voltages are changed and/or the timing of the required signals for activating the data cache change, only the software/firmware of the respective controller needs to be changed to update the memory device. The entire control software does not have to be updated as is required by the prior art.

Figure 3:
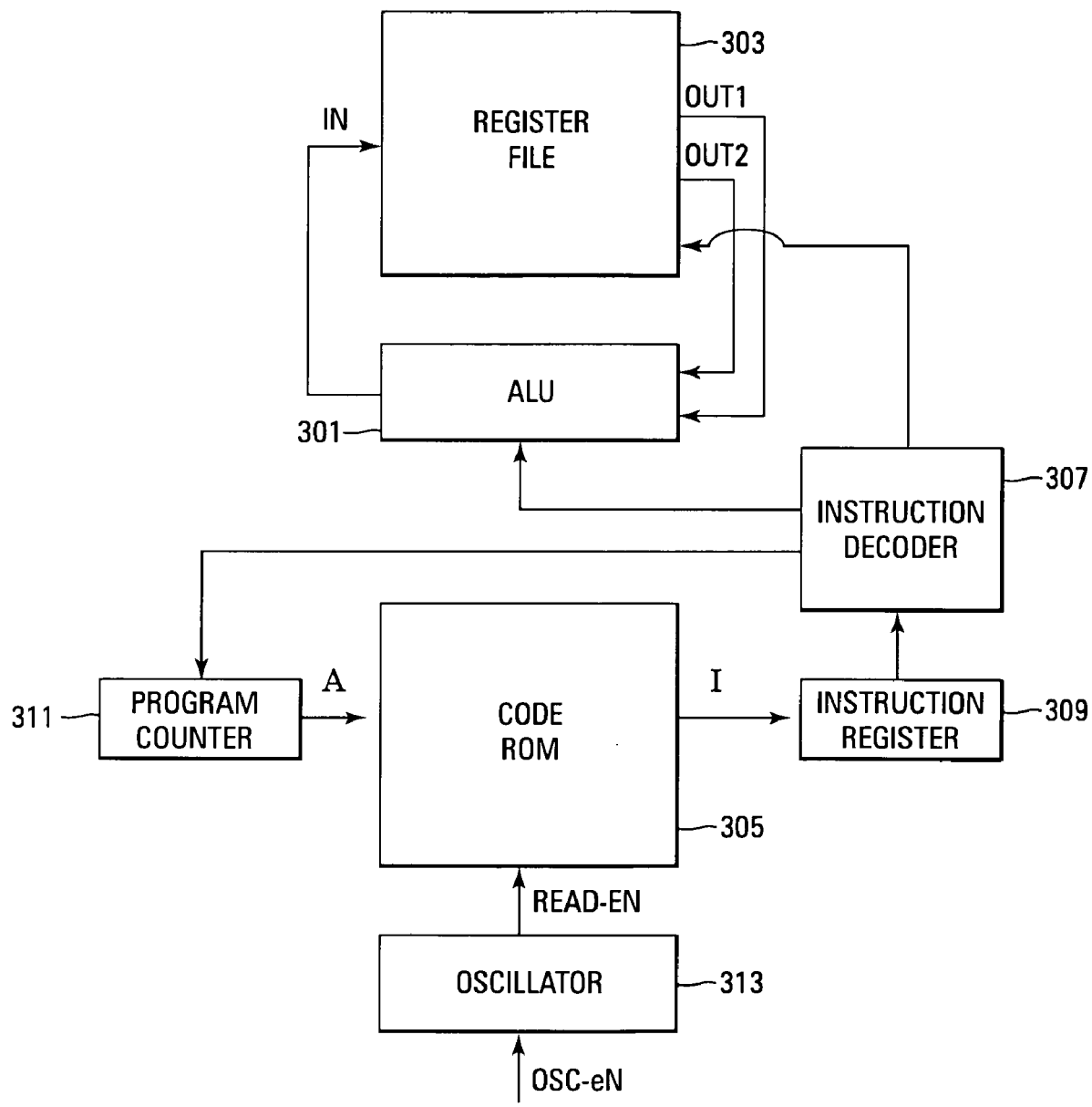
FIG. 3 shows a more detailed block diagram of one embodiment of a basic controller system in accordance with the embodiment of FIG. 2.

FIG. 3 illustrates a block diagram of one embodiment of a controller circuit 205-207 of the present invention as illustrated in FIG. 2. The circuit illustrated is for purposes of illustration only since alternate embodiments may use different functional blocks and/or functional blocks that are coupled in a different configuration to achieve substantially similar results.

The controller circuit is comprised of an arithmetic logic unit (ALU) 301 that performs the math functions of the controller. The ALU 301 performs simple or complex arithmetic and logic operations such as addition, subtraction, comparisons, and other such operations.

The register file 303 is a set of registers for storing temporary information such as counters and voltage values. The register file 303 may store information from the ALU while the data is being operated on. The register file 303 can additionally store signals that are to be transmitted from the circuit or signals that have been transmitted to the circuit.

The code read only memory (ROM) 305 stores binary representations of instructions to be executed by the controller circuit. Typically, the bit matrix of the ROM 305 is generated by a compiler when the memory integrated circuit is designed and the instructions required for controller circuit operation are then known. These are the instructions that determine the timing of control signals and the types of control signals that are generated to control the specific blocks of the memory device to which a specific controller is coupled.

An instruction decoder 307 performs the decoding of instructions that come from the code ROM 305 through an instruction register 309. The register 309 stores the current instruction that has been read from the ROM 305 and is being executed by the instruction decoder 307.

The program counter 311 is a register that stores the address of the current instruction to be executed. The counter 311 is updated after each instruction execution. The next instruction address may be the subsequent address or some other address to which the code is instructed to jump in response to one of the instructions from the ROM 305.

The oscillator 313 is the control circuit system clock. It is activated by the CSM 209 of FIG. 2 through the OSC_EN line after a user command has been received. In one embodiment, one clock cycle is used to execute one instruction. Alternate embodiments may use other quantities of clock cycles per instruction.

Figure 6:
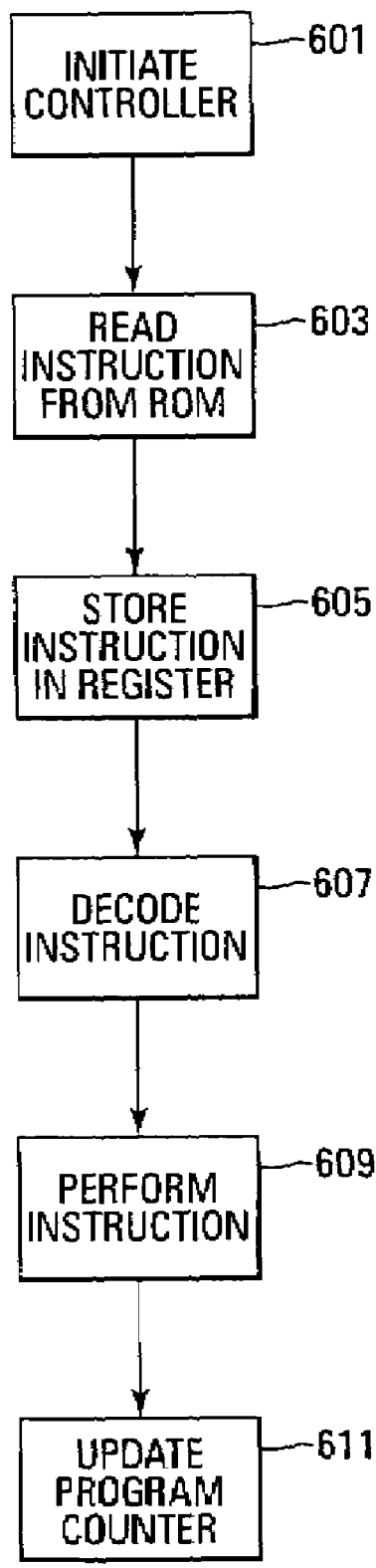
FIG. 6 shows a flow chart for one embodiment of a distributed controller system method of the present invention.

Referring to both FIGS. 3 and 6, the controller circuit operates by initiation 601 of the oscillator 313. An instruction is read 603 from the ROM 305 and stored 605 in the instruction register 309. The instruction is decoded 607 by the instruction decoder 307 and any arithmetic or logic operations are performed 609 by the ALU 301. The program counter 311 is then updated 611 either in response to the last executed instruction or to the next sequential address in the ROM 305.

The performance of the instruction can include generating the signals to activate other controller circuits, as when the master controller activates the analog or data cache controllers. The performance can also include the generation of signals that controls the particular memory peripheral circuitry to which the particular controller is coupled.

Figure 4:
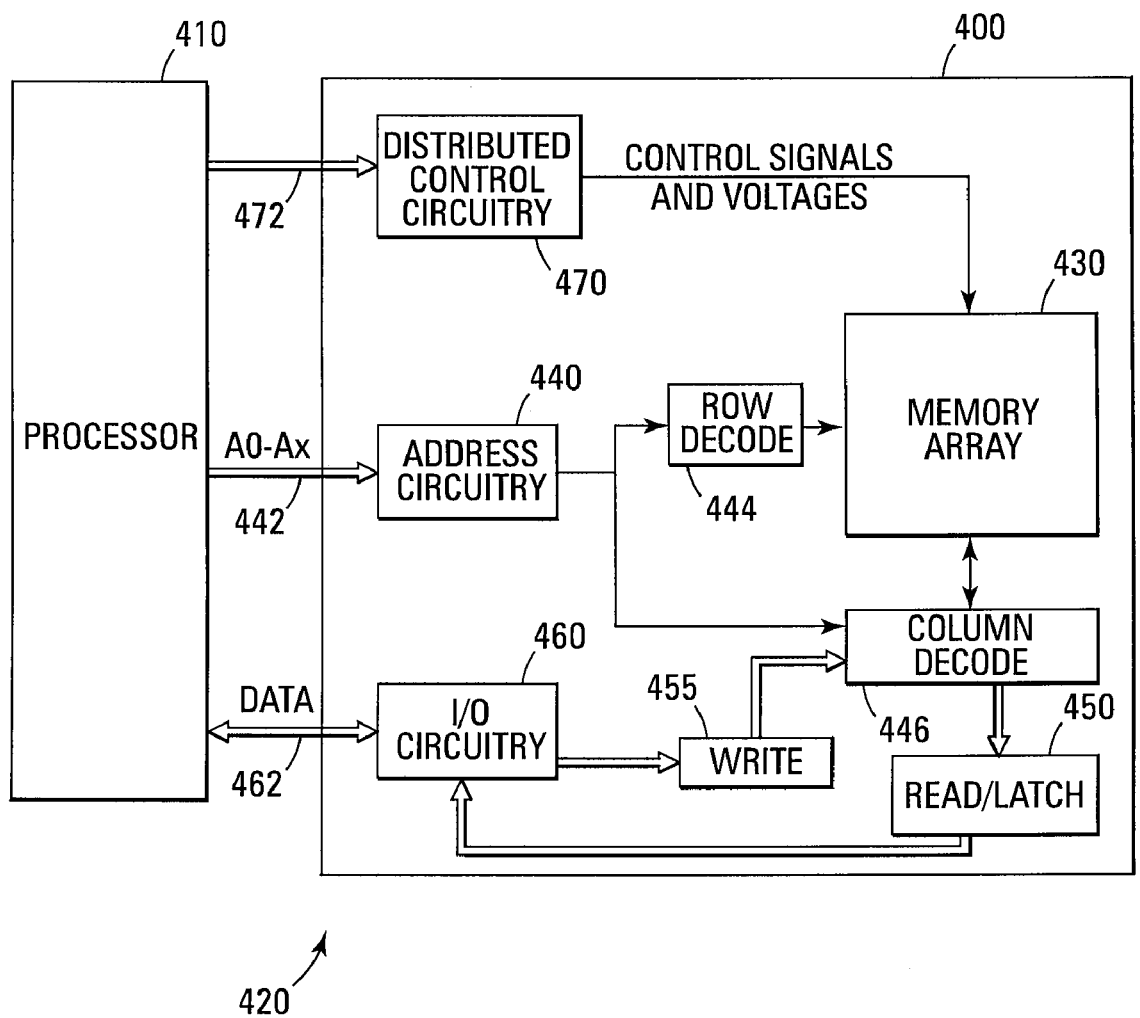
FIG. 4 shows a block diagram of one embodiment of a non-volatile memory device of the present invention as part of a memory system.

FIG. 4 illustrates a functional block diagram of a memory device 400 that can incorporate the non-volatile memory cells of the present invention. The memory device 400 is coupled to a processor 410. The processor 410 may be a microprocessor or some other type of controlling circuitry. The memory device 400 and the processor 410 form part of an electronic system 420. The memory device 400 has been simplified to focus on features of the memory that are helpful in understanding the present invention.

The memory device includes an array of flash memory cells 430 or some other type of non-volatile memory cells. The memory array 430 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture, a NOR architecture, an AND architecture, or some other array architecture.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense amplifier/buffer circuitry 450. The sense amplifier/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

The distributed control circuitry 470 of the present invention decodes signals provided on control connections 472 from the processor 410. The control circuitry 470 architecture and function was previously described in detail.

The flash memory device illustrated in FIG. 4 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

Figure 5:
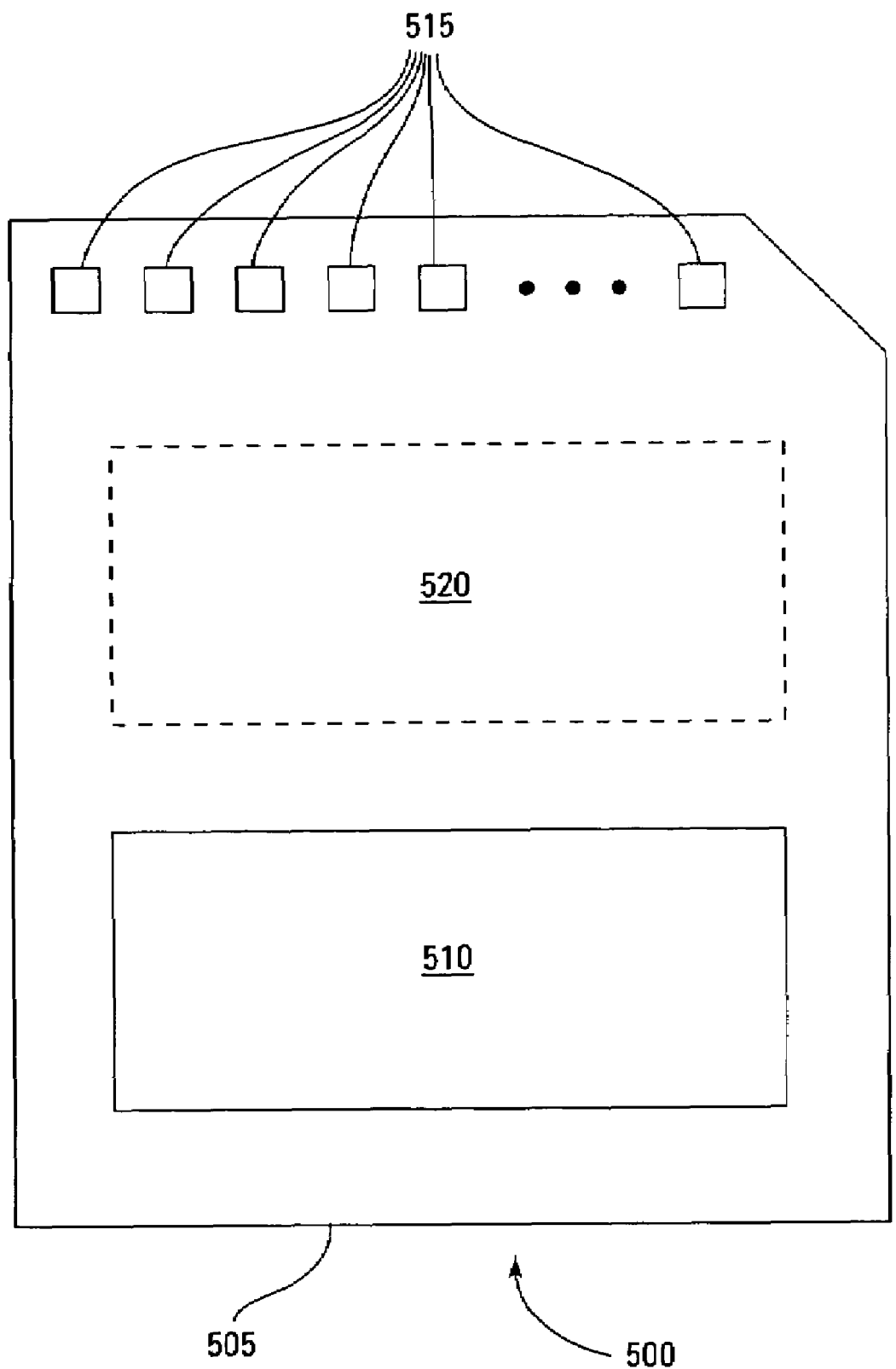
FIG. 5 shows a block diagram for one embodiment of a memory module of the present invention.

FIG. 5 is an illustration of a memory module 500 that incorporates the memory cell embodiments as discussed previously. Although memory module 500 is illustrated as a memory card, the concepts discussed with reference to memory module 500 are applicable to other types of removable or portable memory, e.g., USB flash drives. In addition, although one example form factor is depicted in FIG. 5, these concepts are applicable to other form factors as well.

Memory module 500 includes a housing 505 to enclose one or more memory devices 510 of the present invention. The housing 505 includes one or more contacts 515 for communication with a host device. Examples of host devices include digital cameras, digital recording and playback devices, PDAs, personal computers, memory card readers, interface hubs and the like. For some embodiment, the contacts 515 are in the form of a standardized interface. For example, with a USB flash drive, the contacts 515 might be in the form of a USB Type-A male connector. For some embodiments, the contacts 515 are in the form of a semi-proprietary interface, such as might be found on COMPACTFLASH memory cards licensed by SANDISK Corporation, MEMORY STICK memory cards licensed by SONY Corporation, SD SECURE DIGITAL memory cards licensed by TOSHIBA Corporation and the like. In general, however, contacts 515 provide an interface for passing control, address and/or data signals between the memory module 500 and a host having compatible receptors for the contacts 515.

The memory module 500 may optionally include additional circuitry 520. For some embodiments, the additional circuitry 520 may include a memory controller for controlling access across multiple memory devices 510 and/or for providing a translation layer between an external host and a memory device 510. For example, there may not be a one-to-one correspondence between the number of contacts 515 and a number of I/O connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510. The additional circuitry 520 may include circuitry to restrict read or write access to the memory module 500, such as password protection, biometrics or the like. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

CONCLUSION

In summary, the distributed controller embodiments of the present invention provide improved algorithm execution speed and reduction of operation overhead in a memory device. Additionally, by having multiple dedicated controllers, each coupled to a specific memory function, only the software/firmware for that particular controller needs to be updated when a memory circuit changes.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A distributed control system in a memory device having a memory array for storing data, the system comprising:
   a plurality of controller circuits, each circuit having a different predetermined function wherein at least one controller circuit is a master controller circuit coupled to and controlling at least two other controller circuits and wherein each of the plurality of controller circuits comprise instruction memory for storing instructions, an instruction decoder for decoding instructions from the instruction memory, and a logic unit for performing operations in response to decoded instructions; and
   a plurality of memory peripheral circuits, coupled to the memory array, for generating voltage and data cache signals in response to the plurality of controller circuits, each memory peripheral circuit coupled to and controlled by a different controller circuit of the plurality of controller circuits.

2. The system of claim 1 wherein the memory device is a flash memory device.

3. The system of claim 2 wherein the flash memory device is a NAND flash memory device.

4. The system of claim 1 wherein the predetermined functions include analog voltage control, data cache control, and memory array control.

5. A distributed controller system in a flash memory device having a memory array comprising a plurality of memory cell columns, access to each column controlled by a select gate drain transistor and a select gate source transistor, the system comprising:
   a plurality of controller circuits, each controller circuit having a predetermined function that differs from the predetermined function of the remaining controller circuits, a first controller circuit coupled to each of the remaining controller circuits wherein each of the plurality of controller circuits comprise instruction memory for storing instructions, an instruction decoder for decoding instructions from the instruction memory, and a logic unit for performing operations in response to decoded instructions; and
   a plurality of memory peripheral circuits, coupled to the memory array, for generating voltage and data cache signals in response to the plurality of controller circuits, each memory peripheral circuit coupled to and controlled by a different controller circuit of the plurality of controller circuits.

6. The system of claim 5 and further including a command state machine, coupled to the first controller circuit of the plurality of controller circuits, for accepting and interpreting user commands.

7. The system of claim 5 wherein the first controller circuit is a master controller circuit that controls activation of the remaining controller circuits.

8. The system of claim 6 wherein the first controller circuit is coupled to and generates control signals for the memory array and the remaining controller circuits in response to interpreted user commands.

9. The system of claim 8 wherein the first controller circuit generates control signals to turn on the select gate drain and the select gate source transistors.

10. A flash memory device having a distributed controller system, the device comprising:
a flash memory array comprising a plurality of non-volatile memory cells organized in a plurality of columns, access to each column controlled by a select gate drain transistor and a select gate source transistor;
a data cache for accepting data from and transmitting data to the memory array;
an analog voltage generation circuit for generating analog voltages for operation of the memory array; and
a plurality of controller circuits comprising a master controller coupled to the flash memory array, a data cache controller coupled to the data cache, and an analog controller coupled to the analog voltage generation circuit, the master controller coupled to and adapted to activate both the data cache controller and the analog controller in response to a received command wherein each of the plurality of controller circuits comprise instruction memory for storing instructions, an instruction decoder for decoding instructions from the instruction memory, and a logic unit for performing operations in response to decoded instructions.

11. The flash memory device of claim 10 wherein the master controller is adapted to generate control signals that control operation of the select gate drain and source transistors in response to the received command.

12. A distributed controller system in a flash memory device comprising a memory array, an analog voltage generating circuit, and a data cache, the system comprising:
a data cache controller coupled to and adapted to control the data cache;
an analog controller coupled to and adapted to control the analog voltage generating circuit; and
a master controller coupled to the memory array, the data cache controller, and the analog controller for activating each controller in response to a received command wherein each of the data cache, analog, and master controllers comprise instruction memory for storing instructions, an instruction decoder, coupled to the instruction memory, for decoding instructions from the instruction memory, an arithmetic logic unit for performing operations in response to decoded instructions, and a register file for storing data from the arithmetic logic unit.

13. The system of claim 12 wherein the data cache controller is adapted to generate control signals that enable the data cache to receive data from the memory array in response to a read command and transmit data to the memory array in response to a write command.

14. The system of claim 12 wherein the analog controller is adapted to generate control signals that control voltage levels generated by the analog voltage generating circuit.

15. The system of claim 12 wherein the master controller is adapted to generate control signals that activate circuit elements within the memory array.

16. The system of claim 12 wherein the instruction memory of each of the controllers comprises different instructions in response to a function of each controller.

17. The system of claim 12 wherein the analog controller is not connected to the data cache controller.

18. A memory system comprising:
a processor that generates memory signals; and
a memory device coupled to the processor and operating in response to the memory signals, the memory device comprising:
a flash memory array comprising a plurality of non-volatile memory cells;
a data cache for accepting data from and transmitting data to the memory array;
an analog voltage generation circuit for generating analog voltages for operation of the memory array; and
a plurality of controller circuits comprising a master controller coupled to the flash memory array, a data cache controller coupled to the data cache, and an analog controller coupled to the analog voltage generation circuit, the master controller coupled to and adapted to activate both the data cache controller and the analog controller in response to a received command wherein each of the plurality of controller circuits comprise instruction memory for storing instructions, an instruction decoder for decoding instructions from the instruction memory, and a logic unit for performing operations in response to decoded instructions.

19. The system of claim 18 wherein the memory array is a NAND architecture memory array.

20. A memory module comprising:
at least two memory devices, each comprising:
a flash memory array having a plurality of non-volatile memory cells;
a data cache for accepting data from and transmitting data to the memory array;
an analog voltage generation circuit for generating analog voltages for operation of the memory array; and
a plurality of controller circuits comprising a master controller coupled to the flash memory array, a data cache controller coupled to the data cache, and an analog controller coupled to the analog voltage generation circuit, the master controller coupled to and adapted to activate both the data cache controller and the analog controller in response to a received command wherein each of the plurality of controller circuits comprise instruction memory for storing instructions, an instruction decoder for decoding instructions from the instruction memory, and a logic unit for performing operations in response to decoded instructions; and
a plurality of contacts configured to provide selective contact between the memory array and a host system.

21. The module of claim 20 and further including a memory controller coupled to the memory array for controlling operation of the memory device in response to the host system.

22. A memory module comprising:
a memory device comprising:
a flash memory array having a plurality of non-volatile memory cells;
a data cache for accepting data from and transmitting data to the memory array;

an analog voltage generation circuit for generating analog voltages for operation of the memory array; and a plurality of controller circuits comprising a master controller coupled to the flash memory array, a data cache controller coupled to the data cache, and an analog controller coupled to the analog voltage generation circuit, the master controller coupled to and adapted to activate both the data cache controller and the analog controller in response to a received command wherein each of the plurality of controller circuits comprise instruction memory for storing instructions, an instruction decoder for decoding instructions from the instruction memory, and a logic unit for performing operations in response to decoded instructions; and a housing for enclosing the memory device; and a plurality of contacts coupled to the housing and configured to provide selective contact between the memory array and a host system.

* * * * *